(12) United States Patent
Hirler (10) Patent No.: US 11,515,414 B2
(45) Date of Patent: *Nov. 29, 2022

(54) SEMICONDUCTOR DEVICES AND METHODS FOR FORMING A SEMICONDUCTOR DEVICE

(71) Applicant: Infineon Technologies Austria AG, Villach (AT)

(72) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 28 days.

This patent is subject to a terminal disclaimer.

(21) Appl. No.: 16/985,758

(22) Filed: Aug. 5, 2020

(65) Prior Publication Data
US 2020/0365723 A1  Nov. 19, 2020

Related U.S. Application Data

(63) Continuation of application No. 16/210,624, filed on Dec. 5, 2018, now Pat. No. 10,770,578, which is a
(Continued)

(30) Foreign Application Priority Data

Apr. 30, 2015 (DE) .......................... 102015106707.2

(51) Int. Cl.
*H01L 29/06* (2006.01)
*H01L 29/78* (2006.01)
(Continued)

(52) U.S. Cl.
CPC ...... *H01L 29/7811* (2013.01); *H01L 29/0634* (2013.01); *H01L 29/0882* (2013.01);
(Continued)

(58) Field of Classification Search
CPC ............ H01L 29/0615; H01L 29/7811; H01L 29/0634; H01L 29/0882; H01L 29/7803;
(Continued)

(56) References Cited

U.S. PATENT DOCUMENTS 7,872,300 B2  1/2011  Wahl et al.
7,973,359 B2  7/2011  Hirler et al.
(Continued)

FOREIGN PATENT DOCUMENTS

DE  10041344 A1  3/2001
DE  10100802 C1  8/2002
(Continued)

*Primary Examiner* — Eric K Ashbahian
(74) *Attorney, Agent, or Firm* — Murphy, Bilak & Homiller, PLLC (57) ABSTRACT

A semiconductor device includes an electrical device and has an output capacitance characteristic with at least one output capacitance maximum located at a voltage larger than 5% of a breakdown voltage of the semiconductor device. The output capacitance maximum is larger than 1.2 times an output capacitance at an output capacitance minimum located at a voltage between the voltage at the output capacitance maximum and 5% of a breakdown voltage of the semiconductor device.

11 Claims, 8 Drawing Sheets

Related U.S. Application Data continuation of application No. 15/142,211, filed on Apr. 29, 2016, now abandoned.

(51) Int. Cl.
   *H01L 29/08* (2006.01)
   *H01L 29/66* (2006.01)

(52) U.S. Cl.
   CPC ...... *H01L 29/7803* (2013.01); *H01L 29/0615* (2013.01); *H01L 29/66712* (2013.01)

(58) Field of Classification Search
   CPC ............. H01L 29/1095; H01L 29/7823; H01L 29/41741; H01L 29/7801–7815; H01L 29/66674–66734

See application file for complete search history.

(56) References Cited

U.S. PATENT DOCUMENTS

| | | | |
|---|---|---|---|
| 7,977,737 | B2 | 7/2011 | Willmeroth et al. |
| 10,770,758 | B2 * | 9/2020 | Uhm .................. H01M 10/058 |
| 2008/0135926 | A1 | 6/2008 | Ono et al. |
| 2011/0220992 | A1 * | 9/2011 | Inomata ............. H01L 29/0634 257/330 |
| 2012/0299053 | A1 | 11/2012 | Mauder et al. |
| 2013/0037852 | A1 | 2/2013 | Tamaki |
| 2014/0035002 | A1 | 2/2014 | Cao et al. |
| 2014/0197477 | A1 | 7/2014 | Onishi |
| 2014/0306298 | A1 | 10/2014 | Hirler |

FOREIGN PATENT DOCUMENTS

| | | | | |
|---|---|---|---|---|
| DE | 102006047489 A1 | | 4/2008 | |
| JP | 2015126192 A | | 7/2015 | |
| JP | HP2015126192 | * | 7/2015 | ......... H01L 21/0415 |
| JP | WO2015098237 | * | 7/2015 | ......... H01L 21/0415 |
| WO | 2015098237 A1 | | 7/2015 | |

* cited by examiner

[Forming a semiconductor device] — 810

[Forming a first doping region of a first conductivity type within a semiconductor substrate] — 910

[Forming a feedback path] — 920

FIG. 9

SEMICONDUCTOR DEVICES AND METHODS FOR FORMING A SEMICONDUCTOR DEVICE

RELATED APPLICATIONS

This application claims priority to German Patent Application No. 10 2015 106 707.2 filed on 30 Apr. 2015, and the content of said application incorporated herein by reference in its entirety. This application is a continuation of U.S. application Ser. No. 16/210,624 filed on 5 Dec. 2018, which in turn is a continuation of U.S. application Ser. No. 15/142,211 filed on 29 Apr. 2016, the content of said applications incorporated herein by reference in their entirety.

TECHNICAL FIELD

Embodiments relate to capacitance related modifications of implementation of semiconductor devices and in particular to semiconductor devices and methods for forming semiconductor devices.

BACKGROUND

Several semiconductor devices are based on compensation structures. Such compensation devices are n- or p-channel metal oxide semiconductor field-effect transistors, diodes, insulated gate bipolar transistors (IGBT), thyristors or other components. Compensation devices may be based on mutual compensation of a charge of n- and p-doped areas in the drift region of the transistor. The areas are spatially arranged such that the line integral over the doping along a line running vertical to the p-n-junction remains below the material-specific breakdown charge (approximately $2 \times 10^{12}$ $cm^{-2}$ for lightly doped silicon). For example, in a vertical transistor, p- and n-pillars or plates may be arranged in pairs.

For example, superjunction transistors or CoolMOS™ transistors may comprise an extremely low output capacitance $C_{oss} = C_{ds} + C_{gd}$ and reverse transfer capacitance $C_{gd}$ (gate-drain capacitance) at drain voltages above the depletion voltage (e.g. 10-50V). In this way, very low switching losses may be enabled, since the energy in the output capacitance $E_{oss}$ may be low, however, on the other hand leading to extreme switching edges and—in systems with not sufficiently small parasitics as $L_s$ (parasitic inductance) or external $C_{gd}$-portions—to to ringing and EMI (electromagnetic interference). It is desired to reduce the ringing and/or EMI, for example.

SUMMARY

Some embodiments relate to a semiconductor device comprising an output capacitance characteristic with at least one output capacitance maximum located at a voltage larger than 5% of a breakdown voltage of the semiconductor device. The output capacitance maximum is larger than 1.2 times an output capacitance at an output capacitance minimum located at a voltage between the voltage at the output capacitance maximum and 5% of a breakdown voltage of the semiconductor device.

Some embodiments relate to a semiconductor device comprising a switchable electrical structure implemented on a semiconductor die. The semiconductor die comprises a first doping region of a first conductivity type within a semiconductor substrate. The first doping region is arranged within the semiconductor substrate so that the first doping region floats during at least a part of a transition from an on-state of the switchable electrical structure to an off-state of the switchable electrical structure until a depletion zone reaches the first doping region. At least a part of free charge carriers existing within the first doping region are removed from the first doping region as soon as the depletion zone reaches the first doping region. Further, the semiconductor die comprises a feedback path configured to enable a reflow of charge carriers during transition from the off-state of the switchable electrical structure to the on-state of the switchable electrical structure. The feedback path is configured to block a flow of charge carriers through the feedback path during at least a part of a transition from an on-state of the switchable electrical structure to an off-state of the switchable electrical structure.

Some embodiments relate to a semiconductor device comprising a semiconductor substrate comprising a cell region laterally surrounded by an edge termination region. The edge termination region is configured to support a maximal operating voltage difference applied to the semiconductor device during normal operation between the cell region and an edge of the semiconductor substrate. The semiconductor substrate comprises a first doping region located at an area within the edge termination region comprising between 20% and 80% of the maximal operating voltage difference if the maximal operating voltage difference is applied to the semiconductor device. The first doping region is electrically connected by an electrically conductive structure inside or outside the semiconductor substrate to a capacitance increasing structure located within a region of the edge termination region comprising voltage difference of at least 90% of the maximal operating voltage difference to a region within the cell region.

BRIEF DESCRIPTION OF THE FIGURES

Some embodiments of apparatuses and/or methods will be described in the following by way of example only, and with reference to the accompanying figures, in which.

DETAILED DESCRIPTION

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

Figure 1:
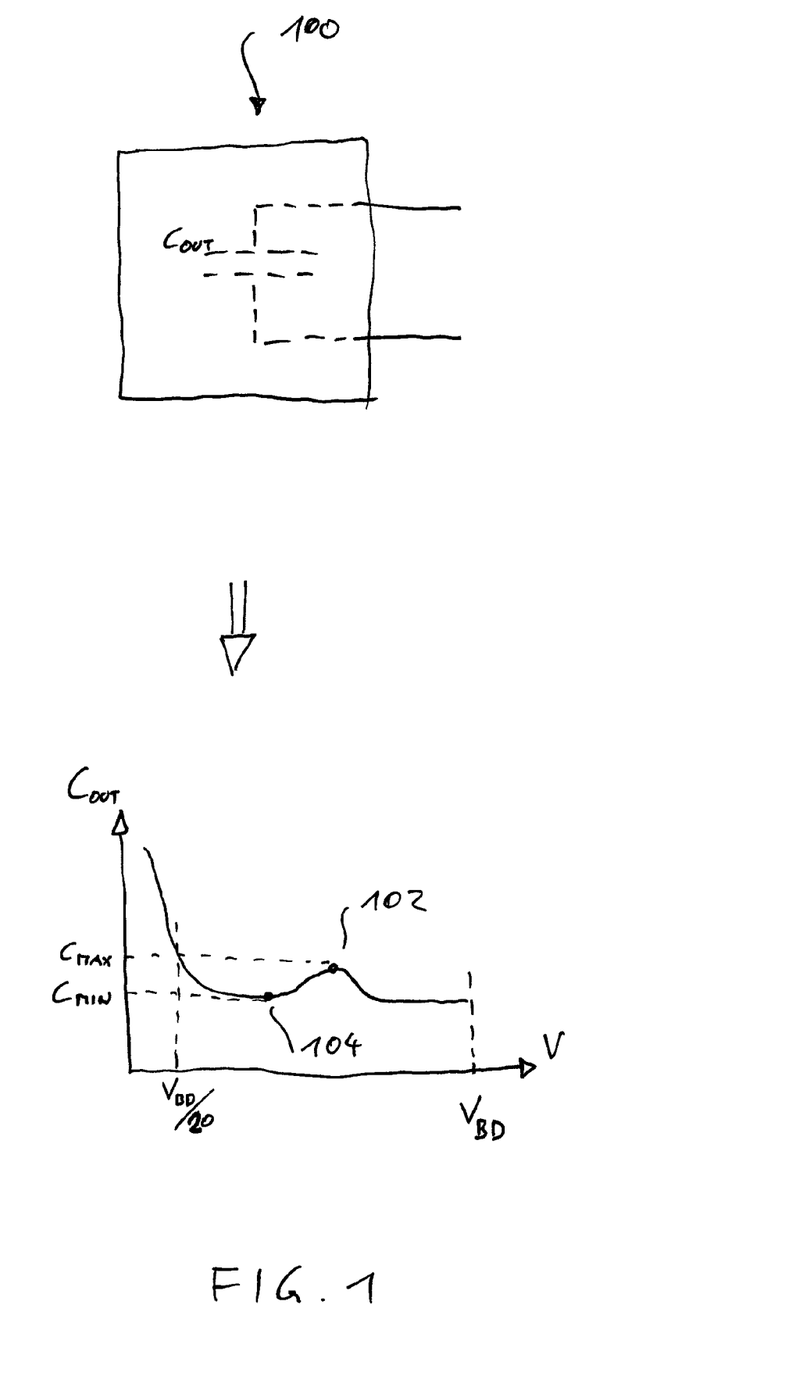
FIG. 1 shows a schematic illustration of a semiconductor device with a possible schematic output capacitance characteristic.

FIG. 1 shows a semiconductor device according to an embodiment. The semiconductor device 100 comprises an output capacitance characteristic with at least one output capacitance maximum $C_{max}$ located at a voltage 102 larger than 5% of a breakdown voltage $V_{BD}$ of the semiconductor device 100. The output capacitance maximum $C_{max}$ is larger than 1.2 times an output capacitance at an output capacitance minimum $C_{min}$ located at a voltage 104 between the voltage 102 at the output capacitance maximum $C_{max}$ and 5% of a breakdown voltage $V_{BD}$ of the semiconductor device 100.

The edge steepness of switching edges of the semiconductor device may be reduced due to the locally increased output capacitance, for example. In this way, ringing and/or EMI may be reduced.

The output capacitance characteristic may represent the course of a capacitance of the semiconductor device 100 versus a voltage applied to two terminals (e.g. externally accessible terminals) of the semiconductor device 100. For example, the output capacitance of the output capacitance characteristic of the semiconductor device 100 may be a drain-source capacitance $C_{ds}$ a gate-drain capacitance $C_{gd}$ or an overall output capacitance represented by a sum of the drain-source capacitance $C_{ds}$ and the gate-drain capacitance $C_{gd}$ of a transistor arrangement implemented by the semiconductor device 100.

The output capacitance maximum $C_{max}$ may be a local maximum of the output capacitance characteristic located above 5% (or above 10% or above 20%) of the breakdown voltage $V_{BD}$ of the semiconductor device 100. The output capacitance characteristic may comprise more than one local maximum located above 5% of the breakdown voltage $V_{BD}$ of the semiconductor device 100. For example, the output capacitance maximum $C_{max}$ may be located at a voltage between 20% and 80% of the breakdown voltage $V_{BD}$ of the semiconductor device 100.

The output capacitance maximum $C_{max}$ may be measured by sweeping an applied voltage from 0V to a nominal voltage or the breakdown voltage of the semiconductor device and measuring the current. The measured capacitance may be a differential capacitance $C_{diff}=dQ/dU$ (dQ may be the charge carrier difference and dU may be the voltage difference) measured during a (slow) linear or monotone increase of the voltage from 0V to a nominal voltage or the breakdown voltage of the semiconductor device. For example, it may be difficult to measure the output capacitance maximum $C_{max}$ with an AC capacitance measurement, since the applied voltage may be varied over a small voltage range during the measurement only so that the effect of the output capacitance maximum $C_{max}$ may be too small when integrating over several voltage oscillations, since the effect of the output capacitance maximum $C_{max}$ may only occur during the first oscillation, if the voltage range of the oscillation during the measurement is too low.

The breakdown voltage $V_{BD}$ of the semiconductor device 100 may be defined by a maximum voltage difference that can be applied to the semiconductor device 100 without damaging the device. The breakdown voltage $V_{BD}$ or blocking voltage of the semiconductor device 100 may be a parameter defined in the datasheet of the semiconductor device. For example, the breakdown voltage of a power field effect transistor may be a maximally allowed drain source voltage in an off-state of the transistor (e.g. gate source voltage equal or close to 0). For example, the semiconductor device 100 may comprise a breakdown voltage $V_{BD}$ of more than more than 10V (e.g. a breakdown voltage of 10 V, 20 V or 50V) 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V or 2000V).

The output capacitance maximum $C_{max}$ is larger than 1.2 (e.g. or larger than 1.5 times or larger than 2 times) the output capacitance minimum $C_{min}$. In other words, the output capacitance maximum $C_{max}$ is larger than 120% (e.g. or larger than 150% or larger than 200%) of the output capacitance minimum $C_{min}$. The output capacitance minimum $C_{min}$ is a capacitance minimum located between the output capacitance maximum $C_{max}$ and 5% of a breakdown voltage $V_{BD}$ of the semiconductor device 100. The at least one output capacitance minimum $C_{min}$ may be located at a voltage arbitrarily close to 5% of the breakdown voltage $V_{BD}$ (e.g. substantially equal to capacitance at 5% of the breakdown voltage), if the output capacitance is monotonically decreasing from the output capacitance maximum $C_{max}$ to the voltage equal to 5% of the breakdown voltage $V_{BD}$. Otherwise, the output capacitance minimum $C_{min}$ may be located somewhere between the output capacitance maximum $C_{max}$ and 5% of a breakdown voltage $V_{BD}$ of the semiconductor device 100.

Optionally, the output capacitance maximum $C_{max}$ may be located in a proximity of a nominal operating voltage of an application using the semiconductor device 100 For example, the nominal operating voltage of an application using the semiconductor device 100 may be between 40% and 80% of the breakdown voltage $V_{BD}$ of the semiconductor device 100. For example, the output capacitance maximum $C_{max}$ may be located at a voltage so that an output capacitance of at least 90% of the output capacitance maximum $C_{max}$ occurs at the nominal operating voltage. Alternatively, the output capacitance maximum $C_{max}$ may be located slightly above the nominal operating voltage (e.g. between 5% and 20% of the nominal operating voltage above the nominal operating voltage). In this way, ringing and/or EMI may be reduced since the increased output capacitance maximum $C_{max}$ may reduce an overshoot or overswing of the voltage. Further, an increase of losses due to the increased output capacitance maximum $C_{max}$ may be avoided for normal switching cycles (e.g. if the voltage does not exceed the nominal voltage), since the increased output capacitance maximum $C_{max}$ is located above the nominal operating voltage, for example.

Figure 2:
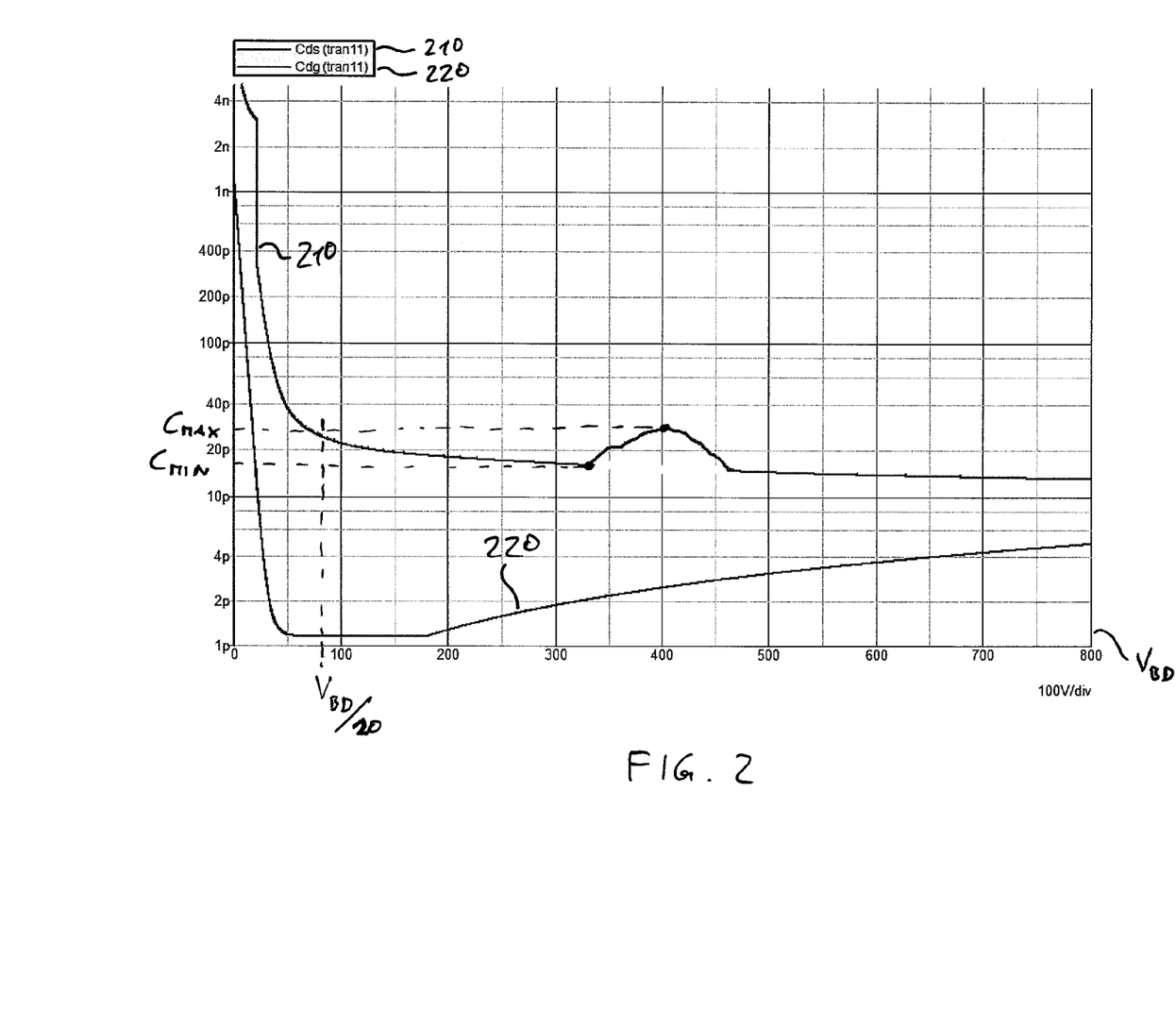
FIG. 2 shows a schematic illustration of an output capacitance characteristic of a semiconductor device.

FIG. 2 shows an example of an output capacitance characteristic represented by the course 210 of the drain-source capacitance $C_{ds}$ and the course 220 of a gate-drain capacitance $C_{gd}$ of a semiconductor device. In this example, an output capacitance maximum $C_{max}$ is implemented at the drain-source capacitance $C_{ds}$ while the gate-drain capacitance $C_{gd}$ of a semiconductor device is implemented without distinctive maximum. For example, FIG. 2 shows a possible dynamic course of capacitance.

Optionally, the output capacitance characteristic comprises a hysteresis loop portion with different output capacitances for increasing voltage and decreasing voltage. For example, a course of the output capacitance characteristic for increasing voltage comprises the output capacitance maximum $C_{max}$ while a course of the output capacitance characteristic for decreasing voltage comprises no or a significantly lower (e.g. less than 1.1 times the output capacitance at the output capacitance minimum) output capacitance maximum at the voltage of the output capacitance maximum $C_{max}$ for increasing voltage. The output capacitance maximum $C_{max}$ for increasing voltage occurs repeatedly during running through the loop, for example.

Optionally, the output capacitance characteristic may comprise a second output capacitance maximum located at a voltage larger than 5% of a breakdown voltage $V_{BD}$ of the semiconductor device 100. The second output capacitance maximum may be larger than 1.2 times the output capacitance at the output capacitance minimum located at a voltage between the voltage at the first output capacitance maximum and 5% of a breakdown voltage of the semiconductor device. Ringing or EMI may be reduced at more than one voltage by implementing a semiconductor device with more than one output capacitance maximum, for example.

The semiconductor device 100 may be any electrical device (e.g. diode, transistor, circuit) comprising a semiconductor substrate or semiconductor die implementing an electrical functionality. For example, the semiconductor substrate of the semiconductor device 100 may be a silicon substrate, a silicon carbide substrate, a gallium arsenide substrate or a gallium nitride substrate or gallium nitride/aluminum gallium nitride on silicon, for example.

For example, the semiconductor device 100 may be a power semiconductor device with a breakdown voltage $V_{BD}$ of more than 100 V.

The output capacitance maximum $C_{max}$ may be implemented or caused by various structural measures or structures of the semiconductor device 100.

For example, the semiconductor device 100 may comprise a switchable electrical structure implemented on a semiconductor die 100. The switchable electrical structure may be one or more field effect transistors, one or more bipolar transistors, one or more insulated gate bipolar transistors which are switchable by applying a corresponding gate voltage or base voltage to the transistor or one or more diodes which are switchable between a forward mode and a reverse (or blocking) mode by an externally applied alternating voltage.

The semiconductor die of the semiconductor device 100 may comprise a first doping region of a first conductivity type (e.g. p-doped or n-doped) within a semiconductor substrate. The first doping region may be arranged within the semiconductor substrate so that the first doping region floats during at least a part of a transition from an on-state (e.g. conducting state or forward state) of the switchable electrical structure to an off-state (e.g. non-conducting state or blocking state) of the switchable electrical structure until a depletion zone reaches the first doping region. At least a part of free charge carriers existing within the first doping region may be removed from the first doping region as soon as the depletion zone reaches the first doping region.

For example, the first doping region is a region within the semiconductor substrate bordered by a region of the second conductivity type and optionally by a surface of the semiconductor substrate. A region comprising the first conductivity type may be a p-doped region (e.g. caused by incorporating aluminum ions or boron ions) or an n-doped region (e.g. caused by incorporating nitrogen ions, phosphor ions or arsenic ions). Consequently, the second conductivity type indicates an opposite n-doped region or p-doped region. In other words, the first conductivity type may indicate a p-doping and the second conductivity type may indicate an n-doping or vice-versa.

For example, the first doping region may also be called floating doping region or output capacitance adapting doping region. The first doping region may be a floating doping region with at least one pn-junction between the first doping region and a structure providing a defined potential during operation of the semiconductor device 100. Alternatively, the first doping region may be connected to a structure providing a defined potential during operation of the semiconductor device 100 through a switchable connecting structure so that the first doping region floats during at least a part of a transition from an on-state of the switchable electrical structure to an off-state of the switchable electrical structure. For example, the switchable connecting structure may be a junction field effect structure reaching a depleted state before the first doping region reaches a depleted state. For example, the switchable electrical structure is configured to reach a non-conductive state during switch-off of the switchable electrical structure before the first doping region is depleted (e.g. before more than 50% of the free charge carriers existing within the first doping region in an on-state of the switchable electrical structure have been removed from the first doping region). In this example, the first doping structure is connected to a structure providing a defined potential in an on-state of the switchable electrical structure and is floating after the switchable connecting structure cuts off the connection to the structure providing a defined potential during the transition from the on-state of the switchable electrical structure to the off-state of the switchable electrical structure.

During the transition from an on-state of the switchable electrical structure to the off-state of the switchable electrical structure a voltage drop over the semiconductor device 100 increases. For example, the depletion zone of a blocking pn-junction of the switchable electrical structure may grow during the increase of the voltage drop and may move towards the first doping region.

The first doping region may be located at a position within the semiconductor substrate so that a depletion zone of a blocking pn-junction reaches the first doping region during switch-off of the switchable electrical structure. At the time, the depletion zone reaches the first doping region, free charge carriers may be removed from the first doping region through the depletion zone. In this way, the output capacitance of the semiconductor device 100 may be increased when the depletion zone reaches the first doping region. For example, the output capacitance maximum is caused by the removal of free charge carriers from the first doping region due to the depletion zone reaching the first doping region.

The voltage at which the first doping region is reached by the depletion zone may be set or defined by a distance between the first doping region and the blocking pn-junction and/or a doping distribution (e.g. doping concentration and/or different regions of different conductivity type) between the first doping region and the blocking pn-junction. In this way, an output capacitance maximum may be implemented at a desired voltage.

The semiconductor substrate may comprise a cell region laterally surrounded by an edge termination region. The cell region may be region of the semiconductor substrate providing more than 90% of a current through the semiconductor substrate in an on-state of the switchable electrical structure. The edge termination region may be located between an edge of the semiconductor substrate and the cell region in order to support or block or reduce or dissipate a maximal voltage applied to the cell region laterally towards the edge of the semiconductor substrate. Alternatively, the semiconductor substrate may comprise more than one cell region and the an edge termination region may be arranged between two neighboring cell regions.

The first doping region may be located within the edge termination region. In this way, a depletion region growing from the cell region towards the edge of the semiconductor substrate may reach the first doping region at a desired voltage during increasing the voltage applied to the cell region, for example. For example, the first doping region may be located at a lateral distance (e.g. in a top view of the semiconductor substrate) from a border between the cell region and the edge termination region and/or from an edge of the semiconductor substrate of more than 20% (or more than 30% or more than 40%) of a minimal distance between an edge of the semiconductor substrate and a border between the cell region and the edge termination region. Alternatively, the first doping region may be located below a gate pad, for example. Further alternatively, the first doping region may be located within an edge termination region arranged between two neighboring cell regions.

For example, a maximal operating voltage difference applied to the semiconductor device during normal operation may occur between a region (e.g. source region) of the cell region and an edge of the semiconductor substrate. For example, the maximal operating voltage difference may be a source-drain voltage of a power field effect transistor in an off-state of the power field effect transistor. The semiconductor substrate may comprises the first doping region located at an area within the edge termination region comprising between 20% and 80% of the maximal operating voltage difference if the maximal operating voltage difference is applied to the semiconductor device.

In some examples, the semiconductor die of the semiconductor device 100 may comprise a feedback path configured to enable a reflow of charge carriers during transition from the off-state of the switchable electrical structure to the on-state of the switchable electrical structure. Further, the feedback path may be configured to block a flow of charge carriers through the feedback path during at least a part of a transition from an on-state of the switchable electrical structure to an off-state of the switchable electrical structure. A reflow of charge carriers to the first doping region may be enabled by the feedback path so that free charge carriers can be repeatedly removed from the first doping region during the switch-off of the switchable electrical structure.

The feedback structure may be implemented in various ways. For example, the feedback path may comprise a diode structure configured to block a flow of charge carriers through the feedback path during at least a part of a transition from an on-state of the switchable electrical structure to an off-state of the switchable electrical structure (e.g. FIG. 3). Alternatively, the feedback path may comprise a second doping region of the first conductivity type configured to be depleted before the depletion zone reaches the first doping region (e.g. FIG. 4 or 5). Further alternatively, the feedback path may comprise a transistor configured to block a flow of charge carriers through the feedback path during at least a part of a transition from an on-state of the switchable electrical structure to an off-state of the switchable electrical structure.

For example, the semiconductor device may comprise a semiconductor die including a power semiconductor transistor arrangement comprising the output capacitance characteristic. The power semiconductor transistor arrangement may comprise a plurality of field effect transistor cells or a plurality of insulated gate bipolar transistor cells, for example The power semiconductor transistor arrangement may be a vertical power semiconductor transistor arrangement. The vertical power semiconductor transistor arrangement may comprise a source electrode structure (e.g. source metal structure) at a front side semiconductor die and a drain electrode structure (e.g. back side metallization) at a back side of the semiconductor die.

The semiconductor die may comprise a first connection interface (e.g. gate pad and/or gate metal structure) connected to a gate structure (e.g. poly silicon gate) of the power semiconductor transistor arrangement, a second connection interface (e.g. source pad and/or source metallization) connected to a source structure (e.g. source doping regions within the semiconductor substrate) of the power semiconductor transistor arrangement and a third connection interface (e.g. drain pad or back side drain metallization) connected to a drain structure (e.g. drain doping region within the semiconductor substrate) of the power semiconductor transistor arrangement.

For example, the output capacitance characteristic represents a drain-source capacitance between the second connection interface and the third connection interface of the power semiconductor transistor arrangement, a gate-drain capacitance between the first connection interface and the third connection interface of the power semiconductor transistor arrangement or a sum of the drain-source capacitance of the power semiconductor transistor arrangement and the gate-drain capacitance of the power semiconductor transistor arrangement.

The power semiconductor transistor arrangement may be a compensation or superjunction transistor arrangement. For example, the power semiconductor transistor arrangement comprises a plurality of cell compensation regions extend into a semiconductor substrate within a cell region of the semiconductor substrate. Further, one or more drift regions may be located adjacent to the plurality of cell compensation regions separating neighboring cell compensation regions of the plurality of cell compensation regions from each other. The cell compensation regions of the plurality of cell compensation regions may comprise the first conductivity type and the one or more drift regions may comprise the second conductivity type. For example, the plurality of cell compensation regions may extend from a front side surface of the semiconductor substrate into a depth of more than 10 µm (or more than 20 µm or more than 50 µm). For example, the cell compensation regions may be pillar-shaped, column-shaped or strip-shaped.

For example, the plurality of cell compensation regions may be regions of the semiconductor substrate comprising a stripe-shape in a top view of the semiconductor substrate of the semiconductor device 100. A stripe-shape may be a geometry extending in a first lateral direction significantly farther than in an orthogonal second lateral direction. For example, the cell compensation regions may comprise a lateral length of more than 10× (or more than 50× or more than 100×) a lateral width of a cell compensation region of the plurality of cell compensation regions. The lateral length of the cell compensation region may be the largest extension along the front side surface of the semiconductor substrate and a lateral width of the cell compensation region may be a shortest dimension of the stripe-shaped cell compensation region. For example, the plurality of cell compensation regions may comprise a vertical extension larger than the lateral width and shorter than the lateral length.

Compensation devices may be based on mutual compensation of at least a part of the charge of n- and p-doped areas in the drift region of the vertical power semiconductor transistor arrangement. For example, in a vertical transistor, p-and n-pillars or plates (one or more drift regions and plurality of cell compensation regions) may be arranged in pairs in a cross section of the semiconductor substrate. For example, the cell compensation regions of the plurality of cell compensation regions may comprise a laterally summed number of dopants per unit area of the first conductivity type deviating from a laterally summed number of dopants per unit area of the second conductivity type comprised by the one or more drift region by less than +/−25% of the laterally summed number of dopants per unit area of the first conductivity type comprised by the cell compensation regions within the cell region.

For example, a strip-shaped cell compensation region of the plurality of strip-shaped cell compensation regions comprises a laterally summed number of dopants per unit area of the first conductivity type (p or n) deviating from half of a laterally summed number of dopants per unit area of the second conductivity type (n or p) comprised by two strip-shaped drift regions located adjacent to opposite sides of the strip-shaped cell compensation region by less than +/−25% (or less than 15%, less than +/−10%, less than +/−5%, less than 2% or less than 1%) of the laterally summed number of dopants per unit area of the first conductivity type comprised by the strip-shaped cell compensation region. The lateral summed number of dopants per unit area may be substantially constant or may vary for different depths. The lateral summed number of dopants per unit area may be equal or proportional to a number of free charge carriers within a strip-shaped cell compensation region or a strip-shaped drift region to be compensated in a particular depth, for example.

For example, the first doping region mentioned above may be located within an edge termination region of the semiconductor substrate and may comprise a number of doping atoms larger than 5 times (or larger than 10 times or larger than 50 times) a number of doping atoms within one cell compensation region of the plurality of cell compensation regions or within one edge termination compensation region of a plurality of edge termination compensation regions located within the edge termination region. For example, the first doping region may comprise substantially the same doping concentration as the cell compensation regions, but may occupy a significantly larger part of the semiconductor substrate. Additionally or alternatively, the first doping region may comprise a doping concentration significantly larger (e.g. 5 times larger or 10 times larger) than a doping concentration (e.g. average or maximal doping concentration) of the cell compensation regions. In this way, the contribution of the first doping region to the output capacitance of the semiconductor device 100 may be larger than a contribution of a cell compensation region or an edge termination compensation region.

For example, the first doping region may be formed simultaneously with the plurality of compensation structures by a mutual implant process, deposition process or growth process.

Figure 3:
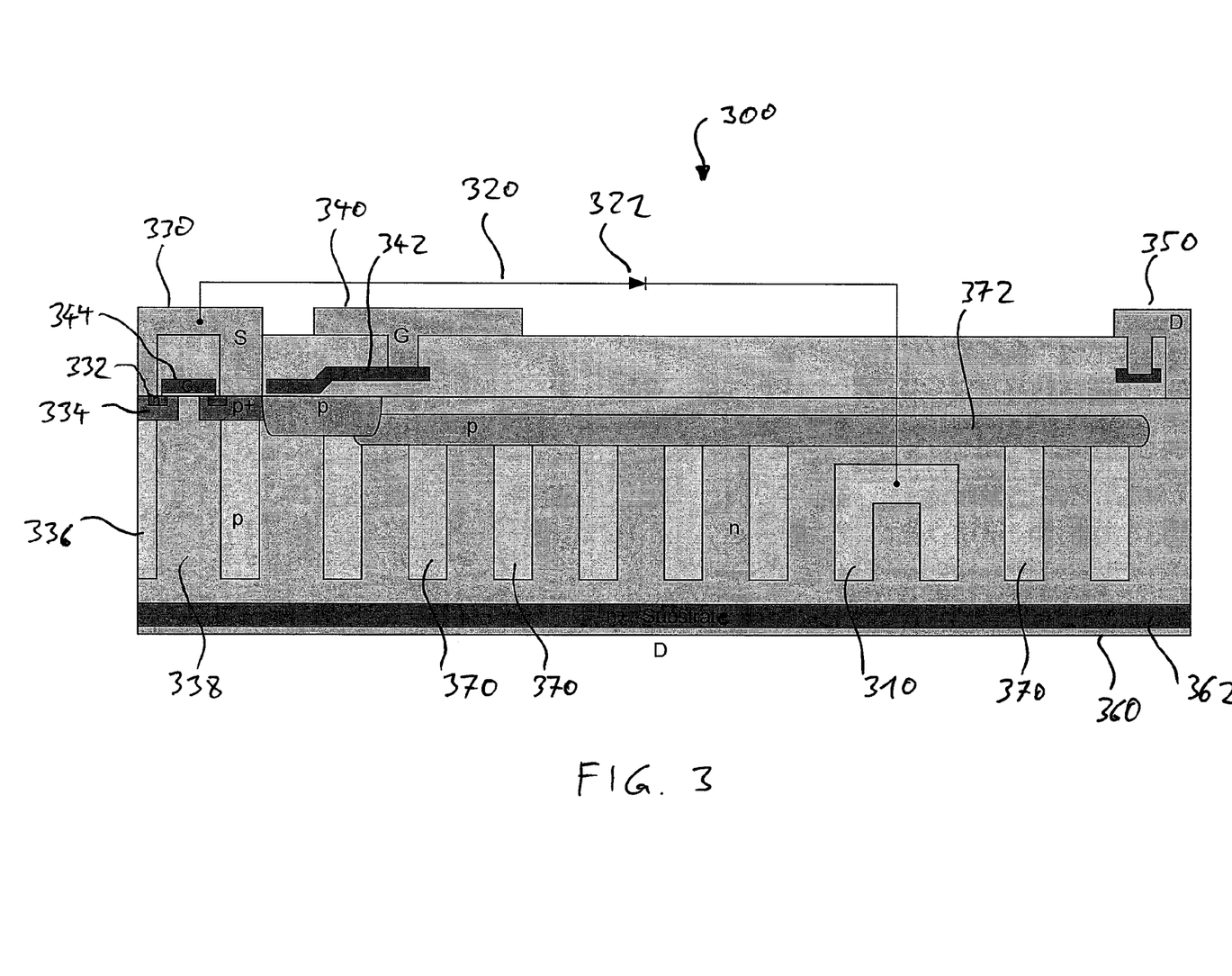
FIG. 3 shows a schematic illustration of a semiconductor device with a doping region causing an output capacitance maximum.

FIG. 3 shows a schematic cross section of a part of a semiconductor device according to an embodiment. The semiconductor device 300 comprises a compensation or superjunction field effect transistor arrangement. The transistor arrangement comprises a plurality of transistor cells within a cell region of a semiconductor substrate of the semiconductor device 300. Each transistor cell comprises a source region 332 of the second conductivity type (e.g. highly n-doped) in contact with a source electrode structure 330 at a surface of the semiconductor substrate. Further, each transistor cell comprises a body region 334 of the first conductivity type located between the source region 332 of the transistor cell and a drift region 338 of the second conductivity type (e.g. lightly n-doped). The body region 334 of the transistor cell may be also in contact with the source electrode structure 330 at the surface of the semiconductor substrate. Further, a cell compensation region 336 of the first conductivity type extends from the body region 334 vertically into the semiconductor substrate. Additionally, a gate 344 is arranged in proximity of the body region 334 in order to control a conduction state (e.g. conducting or non-conducting state) of a channel through the body region 334. Alternatively, the gates may be implemented as trench gates. The gate 334 is connected to a gate electrode structure 340 (e.g. a gate ring laterally surrounding the source electrode structure). The gate electrode structure 340 may comprise a gate field plate 342 arranged at a border between the cell region and the edge termination region. Further, the semiconductor substrate comprises a drain region 362 (e.g. highly n-doped) located at a backside of the semiconductor substrate in contact with a drain electrode structure 360 (e.g. back side metallization). Additionally, a front side drain electrode structure 350 is arranged in proximity to an edge of the semiconductor substrate. Close to the edge of the semiconductor substrate, the drain electrode structure 350 is in contact with a region of the semiconductor substrate comprising the second conductivity type.

A plurality of edge termination compensation regions 370 of the first conductivity type may be arranged within the edge termination region of the semiconductor substrate. The plurality of edge termination compensation regions 370 may be buried regions within the semiconductor substrate. The plurality of edge termination compensation regions 370 may be electrically connected (e.g. directly or through a body region of a transistor cell) to the source electrode structure 330 by a laterally extending doping region 372 of the first conductivity type located at an end of the plurality of edge termination compensation regions 370 close to a front side surface of the semiconductor substrate.

Further, a first doping region 310 is located within the semiconductor substrate. The first doping region 310 is implemented without ohmic path to a structure (e.g. source or drain) providing a defined potential. At least a part of free charge carriers existing within the first doping region 310 are removed from the first doping region 310 as soon as a depletion zone of the body-drain pn-junction reaches the first doping region during switch-off of the transistor arrangement of the semiconductor device 300. The first doping region 310 is connected to the source electrode structure through a feedback path 320 comprising at least one pn-junction (e.g. implemented by a diode structure). For example, an external diode may be connected to the feedback path or a diode structure may be implemented within a poly-silicon layer of the semiconductor device outside the semiconductor substrate. The feedback path 320 enables a reflow of charge carriers during transition from the off-state to the on-state of the transistor arrangement and blocks a flow of charge carriers through the feedback path during at least a part of a transition from the on-state to the off-state of the transistor arrangement, for example.

For example, the output capacitance $C_{oss}$ (and/or $C_{gd}$) may be increased at designated voltage ranges, which may depend on the application.

For example, the dynamic output capacitance may be increased in a predefined voltage range by suitable interconnecting p-columns (e.g. edge termination compensation regions of the first conductivity type) at the edge (e.g. FIG. 2). Dynamically may mean that the capacitance (maximum) may occur during an increase of the voltage only, if the voltage starts at negative or small positive source-drain voltages $V_{ds}$ (some Volts) and not at decreasing voltages, for example.

In order to enable such capacitance courses dynamically, single pillars 310 may be arranged separated from a laterally extending p-region 372 at an edge with p-pillars (and/or n-pillars), which are substantially all connected to the source region through the laterally extending p-region 372, for example. These may be several pillars which are connected to each other within or outside the semiconductor substrate (e.g. shown in FIG. 3). In an example, the distance from the depletion zone generating pn-junction (e.g. the body-epitaxy transition, if the p-labeled regions 372 are able to be depleted) to the floating p-region 310 may be selected so that the depletion zone hits the floating p-region 310 at the defined voltage (e.g. between 300V and 400V) so that an increased amount of charge begins to flow off. This dQ/DU may lead to a desired $C_{oss}$-increase. The $C_{oss}$-increase may occur at the first switch-off only, if the floating p-region 310 is not discharged fast enough during decreasing the voltage. Therefore, a diode 322 may be implemented as dischargedevice (e.g. FIG. 3) which may nearly completely discharge the floating p-region being at negative voltage (e.g. −20V to −40V) during switch-on. The contacting of the floating p-region may be implemented in the third dimension at the semiconductor surface, for example.

FIG. 3 may show an example of a semiconductor device 300 with compensated edge.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIG. 1) or below (e.g. FIGS. 3-9).

Figure 4:
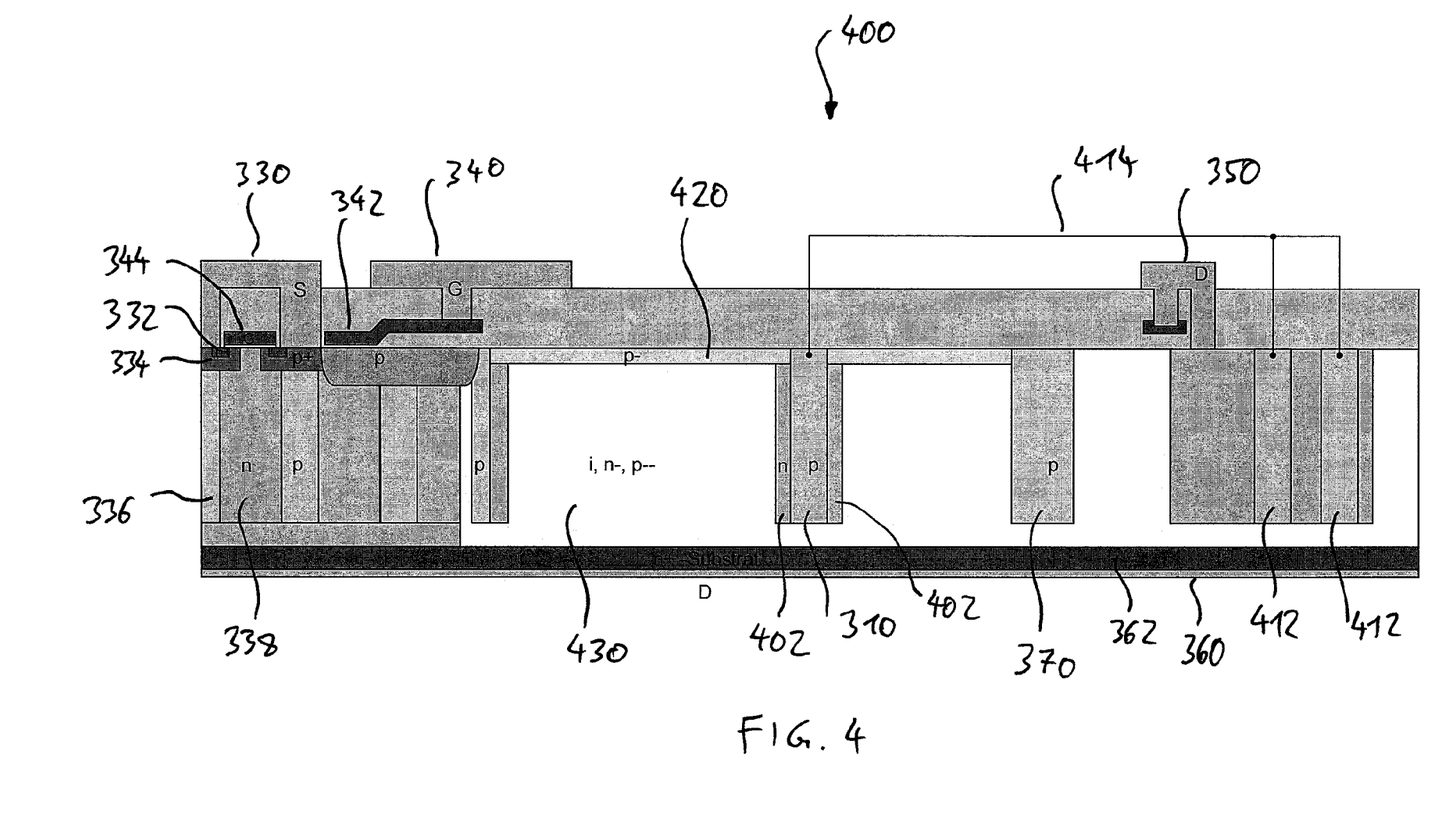
FIG. 4 shows a schematic illustration of a semiconductor device with a capacitance increasing structure.

FIG. 4 shows a schematic cross section of a part of a semiconductor device according to an embodiment. The implementation of the semiconductor device 400 is similar to the implementation of the semiconductor shown in FIG. 3. However, the first doping region 310 is connected to the source electrode structure through a feedback path 420 within the semiconductor substrate. The feedback path 420 comprises a second doping region of the first conductivity type (e.g. lightly doped) configured to be depleted before the depletion zone reaches the first doping region. The feedback path 420 may comprise a junction field effect transistor like structure. For example, the second doping region comprises a dimension and/or a doping concentration so that the second doping region is depleted very early during the switch-off of the transistor arrangement. In this way, a significant amount of free charge carriers is trapped at the first doping region 310 until the depletion zone reaches the first doping region 310, for example. For example, the second doping region may be a shallow doping region at the surface or close to the surface of the semiconductor substrate (e.g. with a depth of less than 10% of a depth of a cell compensation region). Additionally or alternatively, the second doping region may comprise a doping dose of less than $2*10^{12}$ cm$^{-2}$ (or less than $5*10^{11}$ cm$^{-2}$).

Additionally, the first doping region 310 is connected to a capacitance increasing structure through an electrically conductive structure 414. In this way, the number of free charge carriers removable through the depletion region reaching the first doping region 310 may be significantly increased. Therefore, a more pronounced output capacitance maximum may be obtained.

For example, the capacitance increasing structure may be implemented by at least one other doping region 412 comprising the first conductivity type.

Optionally, an additional compensation doping region of the second conductivity type may be located adjacent to the first doping region to enable a partial compensation, for example.

For example, the first doping region 310 may be located at an area within the edge termination region comprising between 20% and 80% of the maximal operating voltage difference if the maximal operating voltage difference is applied to the semiconductor device. The first doping region 310 is electrically connected by the electrically conductive structure 414 inside or outside the semiconductor substrate to the capacitance increasing structure located within a region of the edge termination region comprising a voltage difference of at least 90% of the maximal operating voltage difference to a region within the cell region.

Further, a portion of the semiconductor substrate within the edge termination region which is located adjacent to the drain region 362 may represent an intrinsic semiconductor region without doping or with very low doping (e.g. no doping, lightly n-doped or very lightly p-doped).

FIG. 4 may show an embodiment with intrinsic edge. The edge region may be lightly n-doped or close to intrinsic.

P-pillars may be arranged at suitable distances which may be locally compensated by n-pillars (middle of edge) or uncompensated (similar to p-ring-edges, for example, column 370 between drain electrode structure and first doping region). These columns may be connected to the source contacts by p-regions 420 which can be depleted. The p-regions 420 which can be depleted may be depleted at very low voltages (e.g. <10V or <5V) so that very few pillar charges may flow off through the still (at the beginning of the increase) conducting regions during increase of $V_{ds}$. The charge remaining after depletion (of the p-regions 420) may flow off as soon as the depletion zone hits the pillar (first doping region). In the example of FIG. 4, two dynamic maxima (one for the first doping region and one for the column 370 between drain electrode structure and first doping region) would occur at $C_{oss}$, for example. The connecting p-region may be discharged during switch-on so that the pillars (first doping region and the column 370 between drain electrode structure and first doping region) can be discharged subsequently. The p-pillar 310 which is controlled by the depletion zone may be connected with further pillars (e.g. outside the voltage bearing edge) to increase the capacitance. This may be implemented geometrically in the third dimension or by additional p-regions or by metallic or other connections.

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIG. 1 or 3) or below (e.g. FIGS. 5-9).

Figure 5:
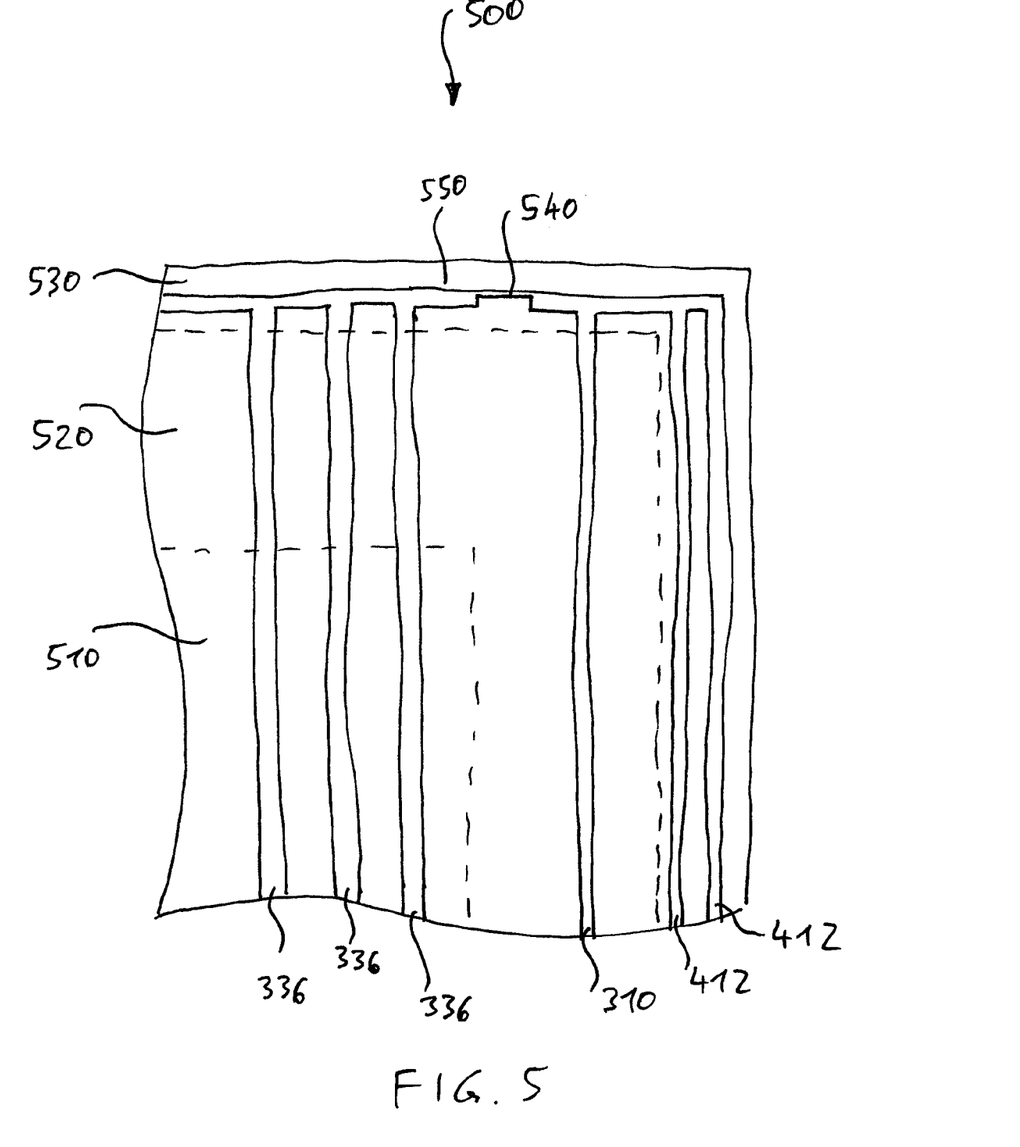
FIG. 5 shows a schematic illustration of a semiconductor device with another capacitance increasing structure.

FIG. 5 shows a schematic top view of a part of a semiconductor device according to an embodiment. The implementation of the semiconductor device 500 is similar to the implementation of the semiconductor shown in FIG. 4. However, the feedback path 550 is implemented close to an edge of the semiconductor substrate. For example, the semiconductor substrate comprises an edge termination region 520 located laterally between a cell region 510 and an edge of the semiconductor substrate. The edge termination region 520 may comprise an edge region 530 being a region of the edge termination region comprising voltage difference of at least 90% of the maximal operating voltage difference to a region within the cell region. In other words, a voltage occurring in the semiconductor substrate within the edge region with respect to the source potential may deviate from the drain voltage by less than 10% of a maximal source drain voltage applied to the semiconductor device 500, for example.

The feedback path may comprise parts with a geometry substantially equal to a geometry of the cell compensation structures 336. The feedback path comprises at least one second doping region 540 of the first conductivity type (e.g. lightly doped) configured to be depleted before the depletion zone reaches the first doping region. For example, the second doping region 540 comprises a dimension and/or a doping concentration so that the second doping region 540 is depleted very early during the switch-off of the transistor arrangement. For example, the second doping region 540 may comprise a lateral width of less than 50% (or less than 30% or less than 20%) of a lateral width of a cell compensation region and/or may comprise a vertical depth of less than 20% (or less than 10%) of a vertical depth of a cell compensation region.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-4) or below (e.g. FIGS. 6-9).

Figure 6A:
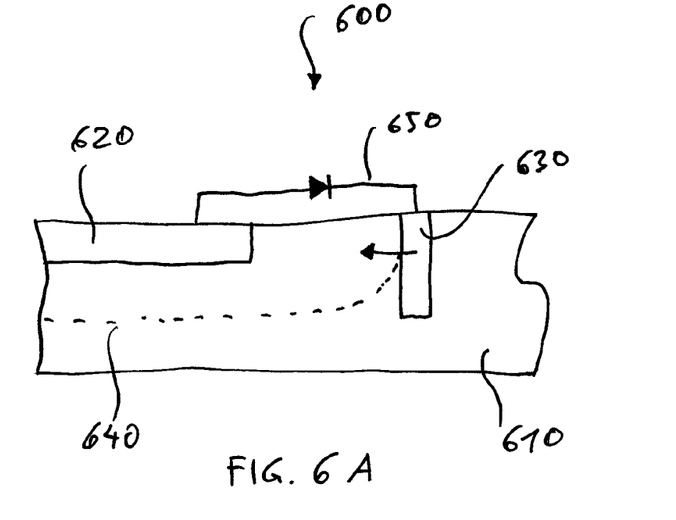
FIG. 6A shows a schematic illustration of a semiconductor device during a transition from an on-state of the switchable electrical structure to an off-state of the switchable electrical structure.
Figure 6B:
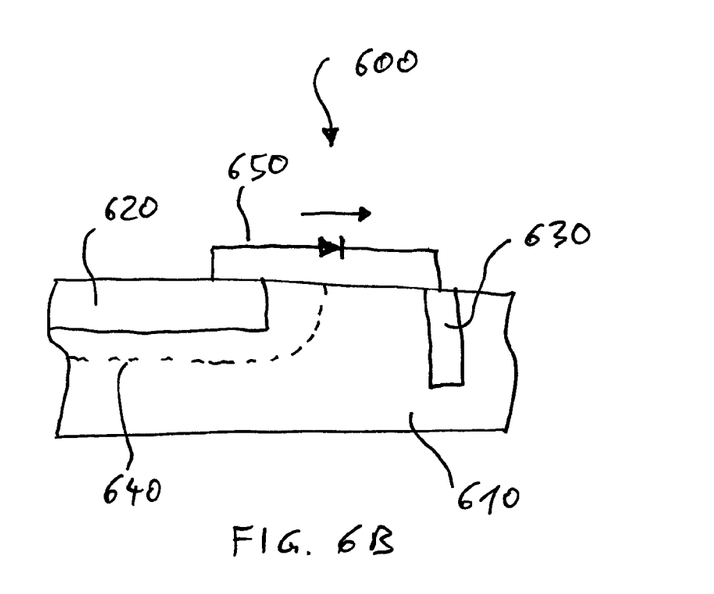
FIG. 6B shows a schematic illustration of the semiconductor device of FIG. 6a during a transition from an off-state of the switchable electrical structure to an on-state of the switchable electrical structure.

FIGS. 6A and 6B show schematic cross sections of a part of a semiconductor device according to an embodiment. The semiconductor device 600 comprises a switchable electrical structure 620 implemented on a semiconductor die. The semiconductor die comprises a first doping region 630 of a first conductivity type within a semiconductor substrate 610. The first doping region 630 is arranged within the semiconductor substrate 610 so that the first doping region 630 floats during at least a part of a transition from an on-state of the switchable electrical structure 620 to an off-state of the switchable electrical structure 620 until a depletion zone 640 reaches the first doping region 630. At least a part of free charge carriers existing within the first doping region 630 are removed from the first doping region 630 as soon as the depletion zone reaches the first doping region 630 (see arrow in FIG. 6A). Further, the semiconductor die comprises a feedback path 650 configured to enable a reflow of charge carriers during transition from the off-state of the switchable electrical structure 620 to the on-state of the switchable electrical structure 620 (see arrow in FIG. 6B). The feedback path 650 is configured to block a flow of charge carriers through the feedback path 650 during at least a part of a transition from an on-state of the switchable electrical structure 620 to an off-state of the switchable electrical structure 620.

The output capacitance may be adapted by implementing the first doping region. For example, an output capacitance maximum may be implemented at a desired voltage. In this way, ringing and/or EMI may be reduced.

Alternatively, the output capacitance may be increased at the region of low voltages at which the output capacitance strongly decreases for increasing voltage (e.g. at voltages between 25V and 50V in FIG. 2). By increasing the output capacitance in this region, the smoothness of switching may be improved.

More details and aspects are mentioned in connection with the embodiments described above (e.g. FIG. 1) or below. The embodiment shown in FIGS. 6A and 6B may comprise one or more optional additional features corresponding to one or more aspects mentioned in connection with the proposed concept or one or more embodiments described above (e.g. FIG. 1-5) or below (e.g. FIGS. 7-9).

Figure 7:
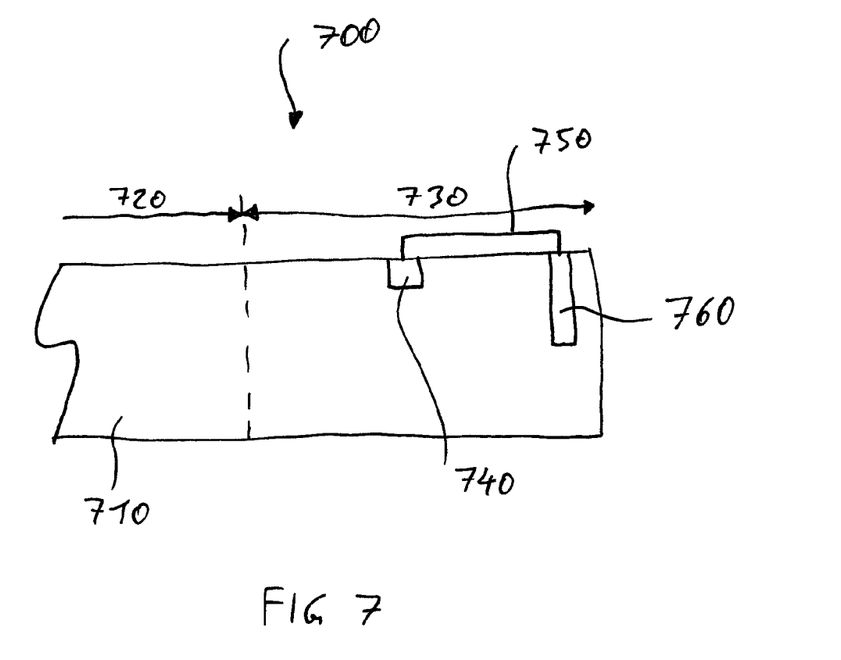
FIG. 7 shows a schematic illustration of a semiconductor device with a capacitive structure.

FIG. 7 shows a schematic cross section of a part of a semiconductor device according to an embodiment. The semiconductor device 700 comprises a semiconductor substrate 710 comprising a cell region 720 laterally surrounded by an edge termination region 730. The edge termination region 730 is configured to support or block a maximal operating voltage difference applied to the semiconductor device 700 during normal operation between the cell region 720 and an edge of the semiconductor substrate. The semiconductor substrate 710 comprises a first doping region 740 located at an area within the edge termination region 730 comprising between 20% and 80% of the maximal operating voltage difference if the maximal operating voltage difference is applied to the semiconductor device 700. The first doping region 740 is electrically connected by an electrically conductive structure 750 inside or outside the semiconductor substrate 710 to a capacitance increasing structure 760 located within a region of the edge termination region 730 comprising a voltage difference of at least 90% of the maximal operating voltage difference to a region (e.g. source region) within the cell region 720.

By connecting structures at the edge of the semiconductor substrate to a doping region closer to the cell region, a doping region with high capacitance may be implemented at desired position within the edge termination region, although only limited space may be available at the desired position.

Optionally, the structure built by the first doping region 740, the capacitance increasing structure 760 and the electrically conductive structure 750 connecting the first doping region 740 and the capacitance increasing structure 760 may be electrically floating or at least floating during a part of a transition of the semiconductor device from an on-state to an off-state.

Further optionally, the capacitance increasing structure 760 may be implemented by at least one second doping region comprising a conductivity type opposite to a conductivity type of semiconductor material of the semiconductor substrate surrounding the at least one second doping region or is implemented by at least one trench filled with electrically conductive material electrically insulated from the semiconductor substrate by an insulation layer within the trench.

More details and aspects are mentioned in connection with the embodiments described above or below. The embodiment shown in FIG. 7 may comprise one or more optional additional features corresponding to one or more aspects mentioned in connection with the proposed concept or one or more embodiments described above (e.g. FIG. 1-6) or below (e.g. FIGS. 8-9).

Figure 8:
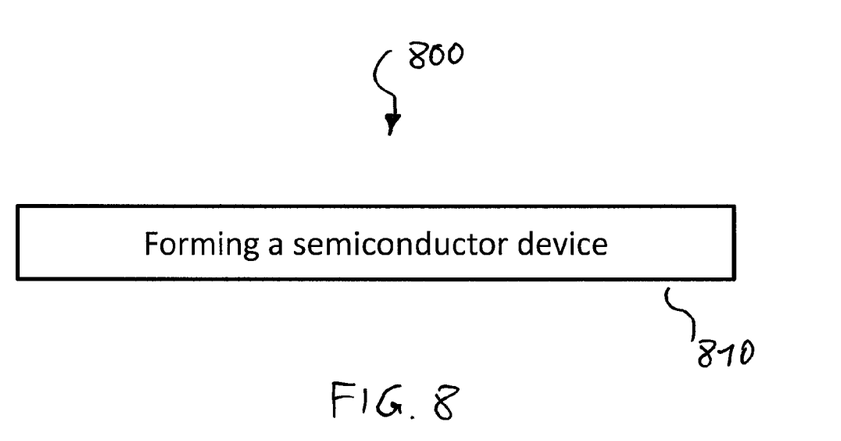
FIG. 8 shows a flow chart for forming a semiconductor device.

FIG. 8 shows a flow chart for forming a semiconductor device according to an embodiment. The method 800 comprises forming 810 a semiconductor device comprising an output capacitance characteristic with at least one output capacitance maximum located at a voltage larger than 5% of a breakdown voltage of the semiconductor device. The output capacitance maximum is larger than 1.2 times an output capacitance at an output capacitance minimum located at a voltage between the voltage at the output capacitance maximum and 5% of a breakdown voltage of the semiconductor device.

More details and aspects are mentioned in connection with the embodiments described above or below. The embodiment shown in FIG. 8 may comprise one or more optional additional features corresponding to one or more aspects mentioned in connection with the proposed concept or one or more embodiments described above (e.g. FIG. 1-7) or below (e.g. FIG. 9).

Figure 9:
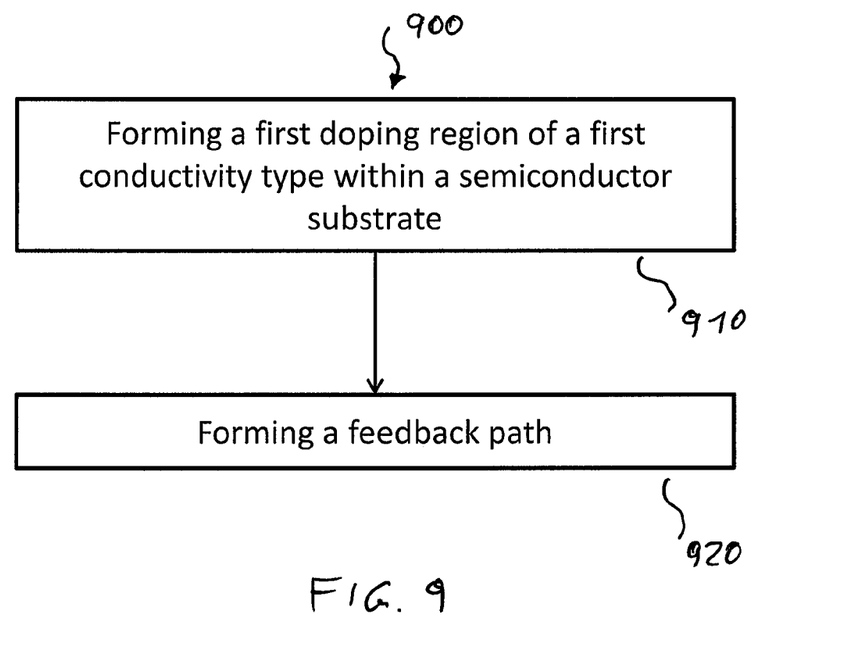
FIG. 9 shows a flow chart for forming another semiconductor device.

FIG. 9 shows a flow chart for forming semiconductor device comprising a switchable electrical structure implemented on a semiconductor die according to an embodiment. The method 900 comprises forming 910 a first doping region of a first conductivity type within a semiconductor substrate. The first doping region is arranged within the semiconductor substrate so that the first doping region floats during at least a part of a transition from an on-state of the switchable electrical structure to an off-state of the switchable electrical structure until a depletion zone reaches the first doping region. At least a part of free charge carriers existing within the first doping region are removed from the first doping region as soon as the depletion zone reaches the first doping region. Further, the method comprises forming 920 a feedback path configured to enable a reflow of charge carriers during transition from the off-state of the switchable electrical structure to the on-state of the switchable electrical structure. The feedback path is configured to block a flow of charge carriers through the feedback path during at least a part of a transition from an on-state of the switchable electrical structure to an off-state of the switchable electrical structure.

Optionally, the structure built by the first doping region, the capacitance increasing structure 760 and the electrically conductive structure may be implemented as shown in FIG. 4.

Alternatively, the structure built by the first doping region, the capacitance increasing structure 760 and the electrically conductive structure may be a doping region extending from the edge termination region comprising between 20% and 80% of the maximal operating voltage difference to the region of the edge termination region comprising a voltage difference of at least 90% of the maximal operating voltage difference to the region within the cell region. In this example, the electrically conductive structure may be implemented inside the semiconductor substrate.

More details and aspects are mentioned in connection with the embodiments described above or below. The embodiment shown in FIG. 9 may comprise one or more optional additional features corresponding to one or more aspects mentioned in connection with the proposed concept or one or more embodiments described above (e.g. FIG. 1-7).

Some embodiments relate to a method for forming a semiconductor device comprising a semiconductor substrate comprising a cell region laterally surrounded by an edge termination region. The edge termination region is configured to support or bear a maximal operating voltage difference applied to the semiconductor device during normal operation between the cell region and an edge of the semiconductor substrate. The semiconductor substrate comprises a first doping region located at an area within the edge termination region comprising between 20% and 80% of the maximal operating voltage difference if the maximal operating voltage difference is applied to the semiconductor device. The first doping region is electrically connected by an electrically conductive structure inside or outside the semiconductor substrate to a capacitance increasing structure located within a region of the edge termination region comprising a voltage difference of at least 90% of the maximal operating voltage difference to a region within the cell region.

More details and aspects are mentioned in connection with the embodiments described above or below.

Some examples relate to a CoolMOS™ (or superjunction transistor) with dynamic $C_{oss}$ maximum. For example, a superjunction transistor with dynamic capacitance maximum at $C_{oss}$ may be provided by implementing single pillars (e.g. at the edge or below the gate pad) which may be charged as soon as the depletion zone hits the pillars at a threshold voltage and may be discharged during switch-on of the CoolMOS™ by a discharge device (e.g. diode).

For example, in applications at which the body diode (in each cycle) gets conductive, floating pillars may be discharged by holes injected by the body diode. The discharge device may be implemented by early deplete-able p-regions outside the edge pillars and connect floating pillars with connected pillars there. The p-regions may be near-surface regions or very small implemented p-pillars (or small spots). A JFET (junction field effect transistor) may be possible as discharge device. For example, the deplete-able p-regions may implement a kind of JFET. Floating p-pillars may be located below the gate pad as well. Instead of a depletion zone controlled p-pillar, a shallow p-region may be used which may be connected to (capacitance) p-pillars or dielectric (trench-) capacitances (e.g. outside the edge or edge termination region). The gates may be implemented as trench gates. The proposed concept may be applicable to non-superjunction transistors as well.

Some embodiments relate to a power semiconductor device. In other words, a semiconductor device according to the described concept or one or more embodiments described above or below may comprise a breakdown voltage of more than 10 V (e.g. between 100 V and 10000 V or more than 200 V, more than 500 V or more than 1000 V).

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some embodiments a single act may include or may be broken into multiple sub acts. Such sub acts may be included and part of the disclosure of this single act unless explicitly excluded.

What is claimed is:

1. A semiconductor device, comprising:
a switchable electrical structure disposed in a semiconductor substrate, the switchable electrical structure comprising a second conductivity type source region, a first conductivity type body region, a second conductivity type drain region, and a conductive gate electrode that is configured to control a conductive connection between the source and drain regions; and
a first doped region of the first conductivity type disposed in the semiconductor substrate;
wherein the switchable electrical structure comprises a varying output capacitance characteristic in an applied voltage range to the source and drain regions from 0 V to a breakdown voltage of the switchable electrical structure,
wherein the first doped region is configured to produce at least one output capacitance maximum in the applied voltage range, and
wherein the at least one output capacitance maximum is larger than 1.2 times the output capacitance of the switchable electrical structure at a voltage between the voltage at the output capacitance maximum and 5% of the breakdown voltage of the switchable electrical structure.

2. The semiconductor device of claim 1, wherein the switchable electrical structure is disposed within a cell region of the semiconductor substrate, wherein the first doped region is disposed within an edge termination region of the semiconductor substrate, and wherein the cell region is laterally separated from an outer edge side of the substrate by the edge termination region.

3. The semiconductor device of claim 2, wherein the first doping region is arranged within the semiconductor substrate so that the first doping region is electrically floating during at least a part of a transition from an on-state of the switchable electrical structure to an off-state of the switchable electrical structure until a depletion zone reaches the first doping region.

4. The semiconductor device of claim 2, wherein a maximal operating voltage difference applied to the semiconductor device during normal operation occurs between a region of the cell region and the outer edge side of the substrate, and wherein the first doping region is located at an area within the edge termination region comprising between 10% and 90% of the maximal operating voltage difference if the maximal operating voltage difference is applied to the semiconductor device.

5. The semiconductor device of claim 1, wherein the semiconductor device further comprises a feedback path connected between the source region and the first doping region, wherein the feedback path is configured to permit charge carriers to flow between the source region and the first doping region during a transition from an off-state to an on-state of the switchable electrical structure and is configured to block a flow of charge carriers between the source region and the first doping region during at least part of a transition from the on-state to the off-state of the switchable electrical structure.

6. The semiconductor device of claim 5, wherein the feedback path comprises a second doping region of the first conductivity type configured to be depleted before the depletion zone reaches the first doping region.

7. The semiconductor device of claim 5, wherein the feedback path comprises a diode structure configured to block a flow of charge carriers through the feedback path during at least a part of a transition from an on-state of the switchable electrical structure to an off-state of the switchable electrical structure.

8. The semiconductor device of claim 1, wherein the varying output capacitance characteristic comprises a second output capacitance maximum located at a voltage larger than 5% of the breakdown voltage of the semiconductor device, wherein the second output capacitance maximum is larger than 1.2 times the output capacitance of the switchable electrical structure at the voltage between the voltage at the output capacitance maximum and 5% of the breakdown voltage of the switchable electrical structure.

9. A semiconductor device, comprising:
 a semiconductor substrate comprising a main surface, a back surface, an outer edge side extending between the main and back surfaces, and a second conductivity type drift region disposed between the main and rear surfaces;
 a switchable electrical structure disposed in a cell region of the semiconductor substrate, the switchable electrical structure comprising a second conductivity type source region, a first conductivity type body region, a second conductivity type drain region, and a conductive gate electrode that is configured to control a conductive connection between the source and drain regions; and
 a first doped region of the first conductivity type disposed in a termination region of the semiconductor substrate;
 a second doping region of the first conductivity type that is electrically connected to the source region and laterally extends from the cell region to the termination region; and
 a plurality of compensation regions that are elongated in a vertical direction that is perpendicular to the main surface and form p-n junctions with the drift region,
 wherein the first doping region is arranged within the semiconductor substrate so that the first doping region is electrically floating during at least a part of a transition from an on-state of the switchable electrical structure to an off-state of the switchable electrical structure until a depletion zone reaches the first doping region,
 wherein the first doping region is laterally disposed between first and second ones of the compensation regions that are each disposed within the edge termination region,
 wherein the first and second compensation regions directly adjoin the second doping region,
 wherein the first doping region is vertically spaced apart from the second doping region by a first distance, and
 wherein the first distance is such that the depletion region expands into the first doping region during the transition from an on-state of the switchable electrical structure to the off-state of the switchable electrical structure.

10. The semiconductor device of claim 9, further comprising a feedback path connected between the source region and the first doping region, wherein the feedback path is configured to permit charge carriers to flow between the source region and the first doping region during a transition from an off-state to an on-state of the switchable electrical structure and is configured to block a flow of charge carriers between the source region and the first doping region during at least part of the transition from the on-state to the off-state of the switchable electrical structure.

11. The semiconductor device of claim 10, wherein the feedback path comprises a diode structure configured to permit the charge carriers to flow between the source region and the first doping region during the transition from the off-state to the on-state and configured to block the flow of charge carriers between the source region and the first doping region during at least part of the transition from the on-state to the off-state of the switchable electrical structure.

* * * * *